United States Patent
Vathulya

(10) Patent No.: US 6,725,030 B2
(45) Date of Patent: Apr. 20, 2004

(54) CMOS RADIO FREQUENCY AMPLIFIER WITH INVERTER DRIVER

(75) Inventor: Vickram Vathulya, Ossining, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 533 days.

(21) Appl. No.: 09/753,107

(22) Filed: Dec. 28, 2000

(65) Prior Publication Data

US 2002/0086649 A1 Jul. 4, 2002

(51) Int. Cl.[7] .................................. H04D 1/16
(52) U.S. Cl. ................... 455/341; 455/333; 455/253.1; 455/252.1
(58) Field of Search ................ 455/341, 332, 455/338, 427, 112, 118, 119, 323, 313, 130, 333, 253.1, 252.1; 332/154, 180; 330/118, 250–259

(56) References Cited

U.S. PATENT DOCUMENTS

| | | | | |
|---|---|---|---|---|
| 4,635,296 A | * | 1/1987 | Dinsmore | 455/113 |
| 4,688,000 A | * | 8/1987 | Donovan | 330/269 |
| 4,704,738 A | * | 11/1987 | Graziadei et al. | 455/252.1 |
| 5,111,157 A | * | 5/1992 | Komiak | 330/286 |
| 5,420,537 A | * | 5/1995 | Weedon et al. | 330/251 |
| 5,446,412 A | * | 8/1995 | Kimyacioglu et al. | 330/255 |
| 6,100,763 A | * | 8/2000 | Durec et al. | 330/267 |
| 6,122,492 A | * | 9/2000 | Sears | 455/127.1 |
| 6,275,686 B1 | * | 8/2001 | Hotine | 455/253.2 |

FOREIGN PATENT DOCUMENTS

FR    2536224 A1    5/1984    ........... H03F/3/195

OTHER PUBLICATIONS

Steve Cripps, "RF power Amplifiers for Wireless Communications".

* cited by examiner

Primary Examiner—Pablo N. Tran
(74) Attorney, Agent, or Firm—Aaron Waxler

(57) ABSTRACT

A MOSFET amplifier includes a pre-amplifier stage and a power amplifier stage. The pre-amplifier is a CMOS inverter having a signal output that is DC connected to the gate of a MOS control transistor of the power amplifier stage. The CMOS inverter includes an NMOS transistor with a source connected through an inductor to ground and a drain to the source of a PMOS transistor. The drain of the PMOS transistor is connected through another inductor to a supply voltage. The gates of the NMOS and PMOS transistors are connected to both receive an input signal of the amplifier.

14 Claims, 2 Drawing Sheets

US 6,725,030 B2

CMOS RADIO FREQUENCY AMPLIFIER WITH INVERTER DRIVER

FIELD OF THE INVENTION

This invention relates to the field of radio frequency amplifiers for hand-held communication devices, using deep submicron CMOS technology (e.g. 0.25 µm).

BACKGROUND OF THE INVENTION

Amplifiers for radio frequency transmission generally consist of a driver or preamplifier stage and a power amplifier stage. In the design of high voltage analog CMOS amplifiers, the potential for gate rupture limits the supply voltage and thus, the power that may be provided by a particular amplifier design. MOSFET devices for radio frequency power amplifiers are being designed for operations at very low supply voltages (e.g. less than 2.5 V) in hand-held devices to prevent gate rupture. However, decreasing the supply voltage for a given technology decreases the output power and efficiency of the amplifier.

Shaping the voltage waveform of the amplifier input signal has been proposed as a potential solution to increasing supply voltage without gate rupture in "RF Power Amplifiers for Wireless Communications" by Steve Cripps. Others have proposed lightly doping the drain regions and increasing the oxide thickness to increase the breakdown voltage for MOS devices.

The above references are hereby incorporated herein in whole by reference.

SUMMARY OF THE INVENTION

Deep submicron CMOS technology (e.g. 0.25 µm) is being developed for achieving high cut-off frequencies required for higher frequency hand-held communication devices. Such technology provides very thin gate oxide layers (e.g. 50 A for 0.25 µm devices) which results in breakdown at peak voltages of around 6V between the gate and the drain of the power amplifier. In radio frequency analog CMOS amplifiers the signal swing at the drain of the power transistor may be 2–3.5 times the supply voltage.

In a first aspect of the invention herein, the driver portion of the amplifier modifies the shape of the driver output signal with respect to the driver input signal. Specifically the driver increases the amplitude of the positive excursions with respect to the amplitude of the negative excursions with respect to the average voltage of the signal (the DC component with respect to ground). Preferably, the peak voltage of the positive excursions with respect to average voltage (the DC component with respect to ground) is at least 30% less than the peak voltage of the negative excursions with respect to the average voltage. More preferably, the negative excursions are less than half the positive excursions.

In a second aspect of the invention, the input signal to the power amplifier stage has a sufficient positive bias to reduce the peak voltage difference between the terminals of the power transistor so that breakdown is prevented. Preferably, the bias voltage is equal to at least 50% of the amplitude of the negative excursions with respect to the average voltage of the driver output signal and more preferably is approximately equal to the amplitude of the negative excursions. Preferably, the signal shape modification together with the signal bias is selected so that the voltage of the peak negative excursions have an absolute value with respect to ground that is less than 30% of the positive value of the positive excursions with respect to ground, and more preferably, less than 10% of the positive value of the positive excursions. By keeping the lower excursion close to zero volts at the gate of the drive transistor of the power amplifier, the maximum supply voltage of around 2.5V, typically used for 0.25 µm CMOS, can be provided to the power amplifier without gate rupture.

Herein ground simply means a reference voltage that is different than the supply voltage. For handheld devices, the ground voltage level is different than the voltage level of the Earth.

In a third aspect of the invention the driver includes an inverter to both modify the shape of the driver output signal with respect to the driver input signal and to provide the required bias.

In a fourth aspect of the invention, the amplifier driver includes a CMOS inverter with a pull-down inductance and a pull-up inductance. The pull-down and pull-up inductances as well as the relative size of a PMOS and NMOS transistors of the inverter are selected to both modify the shape of the driver output and to provide the required bias.

Advantageously, the bias point and hence the output power of the power amplifier can be regulated by controlling the supply voltage to the driver stage of the amplifier. Alternately, the output power can be regulated by controlling the supply voltage to the power amplifier stage of the amplifier. It is also possible to control the output power by controlling the amplitude of the input signal of the driver stage.

Those skilled in the art will understand the invention and additional objects and advantages of the invention by studying the description of preferred embodiments below with reference to the following drawings which illustrate the features of the appended claims:

DETAILED DESCRIPTION OF PREFERRED EMBODIMENTS AND BEST MODE

Figure 1:
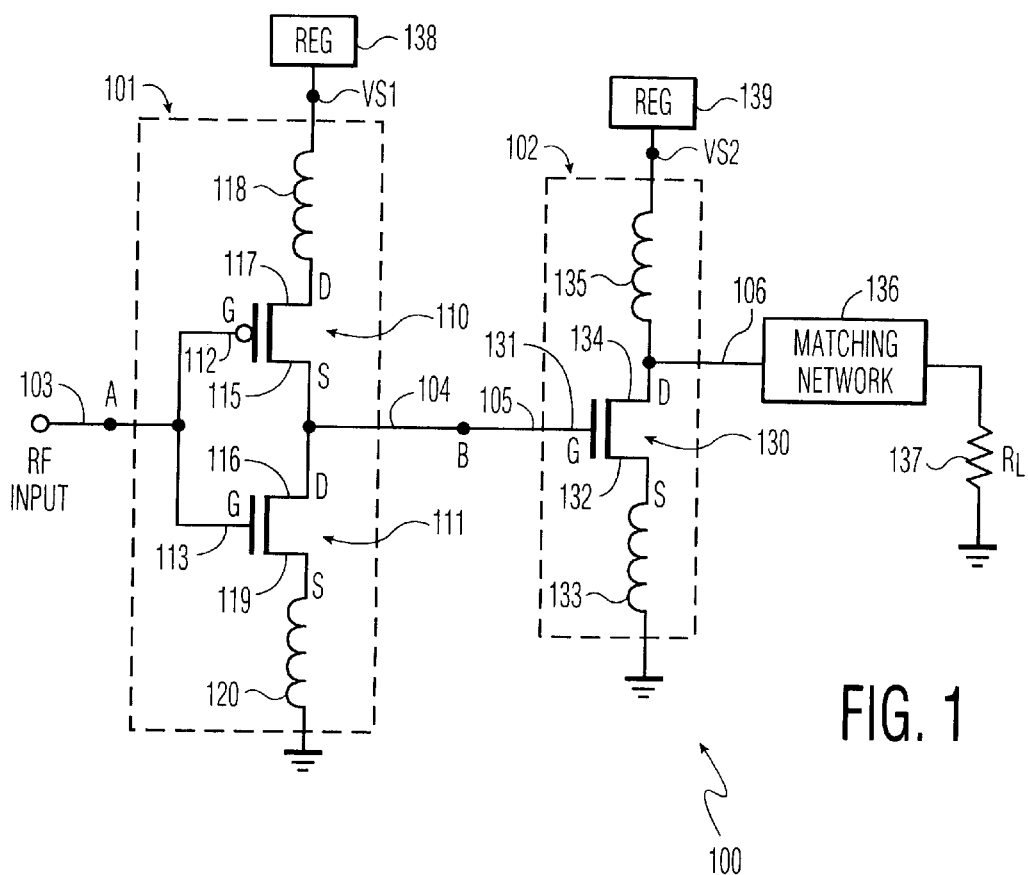
FIG. 1 illustrates the amplifier of the invention.

FIG. 1 shows an amplifier 100 including a driver 101 and a power amplifier 102. The driver or pre-amplifier 101 receives an input signal at input 103 and modifies the input signal to provide an output signal at output 104. There is a DC connection between signal output 104 of the driver and the signal input 105 of the power amplifier so that a DC bias provided by driver 101 reaches the power amplifier.

The driver or pre-amplifier includes PMOS transistor 110 and NMOS transistor 111 connected in an inverter configuration. Gate 112 of transistor 110 and gate 113 of transistor 111 are both connected to input 114. Source 115 of transistor 110 is connected to drain 116 of transistor 111 and to signal output 104. Drain 117 of transistor 110 is connected to a first supply voltage through pull-up inductance 118. Source 119 of transistor 111 is connected to ground through pull-down inductance 120. The inductance of each of inductances 118 and 120 as well as the relative sizes of transistors 110 and 111 are selected to provide, at output 104 of the driver, the desired modification (translation) of the signal at input 103 of the driver. Those skilled in the art will be able to determine the inductances and relative sizes of the transistors to provided the desired transformation.

Alternatively, It is possible to replace one or both of inductances 112, 113 with resistances. Also, in a bipolar embodiment (not shown), the PMOS and NMOS transistors may be replaced with bipolar transistors such as PNP and NPN transistors respectively.

The power amplifier in this specific embodiment, includes a power NMOS transistor 130 with a gate 131 connected to the input 105 of the power amplifier. A source terminal 132 of transistor 130 is connected to ground through an pull-up inductance 133. A drain terminal 134 of transistor 130 is connected to a second supply voltage through pull-up inductance 135. The drain is also connected to output terminal 106 of the power amplifier. Output terminal 106 is connected to ground through matching network 136 and load resistor 137.

In power amplifier 102 transistor 130 may be a PMOS transistor in which case the positions of the source and drain terminals would be reversed (i.e. the polarity would be reversed). Also, either or both inductances 119 and 121 may be replaced by resistances.

The properties of the amplifier can be controlled by regulating the supply voltage. Regulator 138 controls the first supply voltage to the driver allowing the class of the amplifier to be modified during operation. Alternately, or in addition, Regulator 139 controls the supply voltage to the power amplifier stage which controls the power output from the amplifier. The properties of the amplifier can also be regulated by regulating the amplitude of the input signal to the driver. As the amplitude of the input signal increases the output power increases and the efficiency of the amplifier increases.

Figure 2:
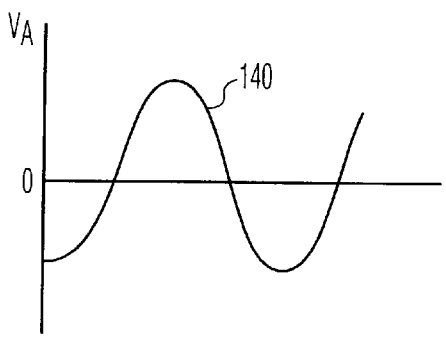
FIG. 2 illustrates an input signal to the driver of the amplifier at point A in FIG. 1.
Figure 3:
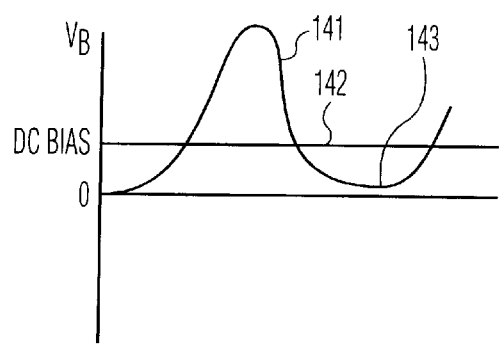
FIG. 3 illustrates an output signal from the driver at point B in FIG. 1.

FIG. 2 shows the shape of driver input signal 140 at the input of driver 101. The driver transforms this input signal to provide driver output signal 141 shown in FIG. 3 at output 103 of the driver. The signal has a positive DC bias 142 so that the maximum negative excursion at 143 is around zero volts. Signal 141 provided to the input 105 of power amplifier 102. The peak negative difference in voltage between gate 131 and drain 134 is minimized to prevent rupture of the thin $SiO_2$ gate layer.

Figure 4:
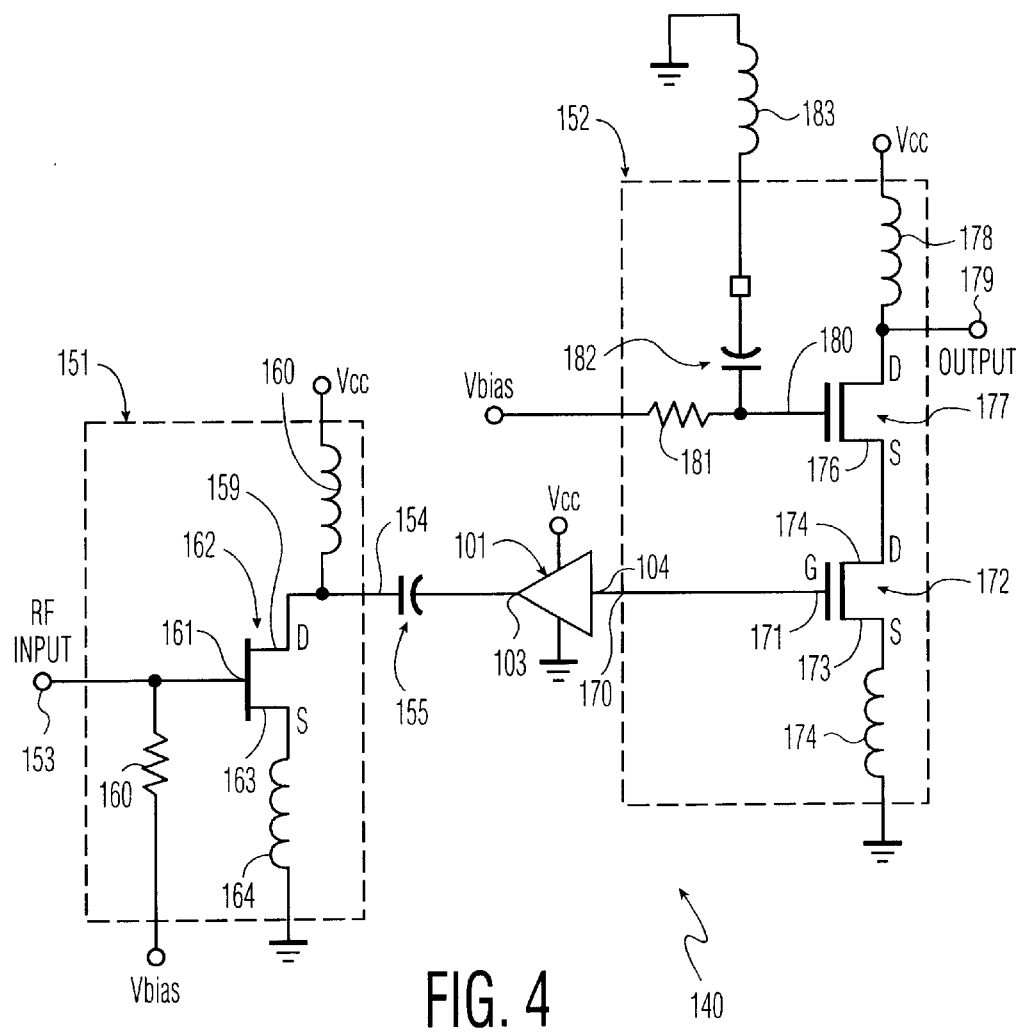
FIG. 4 shows an alternate embodiment of the amplifier of the invention.

FIG. 4 illustrates another specific embodiment of the invention. Amplifier 140 includes a first pre-amplifier 101 (which is identical to the driver 101 of FIG. 1) and a second pre-amplifier 151 has been provided before pre-amplifier 101. Also, a more complex power amplifier 152 has been provided to allow even higher supply voltages to the power amplifier. A radio frequency signal is provided to input 153 of the second driver and the second driver amplifies the input signal and outputs the amplified signal at output 154. Output 154 is DC isolated from input 103 of driver 101 by capacitor 155.

In the second pre-amplifier, a radio frequency input signal is provided to input 153 and supplied to gate 161 of NMOS transistor 162. The input signal is biased for example by a connection to a DC bias voltage through resistor 160. Source terminal 163 of transistor 162 is connected to ground through pull-down inductance 164 and drain terminal 159 of transistor 156 is connected to the supply voltage through pull-up inductance 160. Drain terminal 159 is connected to output terminal 154 of pre-amplifier 151 which in turn is connected to input 103 of pre-amplifier 101 through capacitor 155 so that the signal at input 103 does not have any DC component.

The use of a second pre-amplifier increases the overall gain of the amplifier without affecting the pre-shaping of the first pre-amplifier.

The output signal of driver 101 is provided from output terminal 104 to the signal input 170 of power amplifier 152. The input signal of the power amplifier is provided from input 170 to gate 171 of NMOS transistor 172. Source 173 of transistor 172 is connected to ground through pull-down inductance 174. Drain 175 of transistor 172 is connected to source 176 of PMOS transistor 177. Drain 178 of transistor 177 is connected to source voltage through pull-up inductance 184. Drain 178 is also connected to output 179 of power amplifier 152.

Gate 180 of transistor 177 is connected to bias voltage through resistor 181 to provide a bias voltage to the gate. Gate 180 is also connected to ground through capacitor 182 and inductance 183.

The bias voltage, the resistance of resistor 181, the capacitance of capacitor 182 and the inductance of inductor 183 are selected to reduce the peak voltage between the drains and the gates of transistors 172 and 177 at the expected operating frequency to prevent breakdown of the gates.

The embodiment of FIG. 4 uses much more area on the integrated circuit than the embodiment of FIG. 1, but allows higher supply voltages to be used and thus provides higher power amplification.

Figure 5:
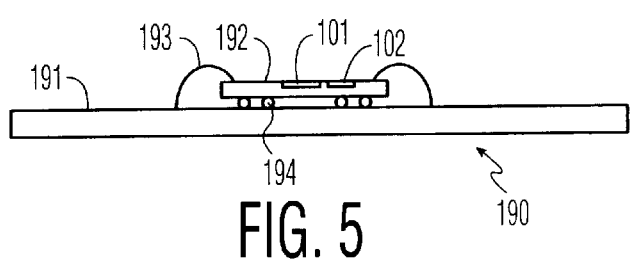
FIG. 5 illustrates a circuit board assembly of the invention.

FIG. 5 illustrates an a circuit board assembly 190 including a circuit board 191 to which an integrated circuit chip 192 is connected by bond wires 193 and/or flip chip connections 194. The integrated chip includes driver 101 of FIG. 1 communicating with power amplifier 102 of FIG. 1.

Figure 6:
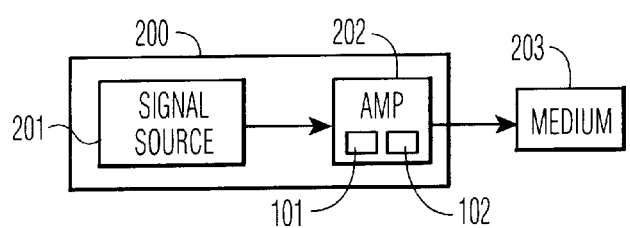
FIG. 6 illustrates a transmitter of the invention.

FIG. 6 illustrates the transmitter 200 of the invention. The transmitter may be a transmitter for terrestrial or satellite broadcasting of radio frequency electromagnetic signals from an antenna such as a hand-held radio (e.g. a cellular phone) or a storage device such as an optical disk drive or magnetic hard drive; or a laser transmitter of a telephone, cable television, or similar optical broadband network through optical fibers; or a transmitter of electronic signals through wires, for example, between computer devices, or any other know use of radio frequency signals.

The transmitter includes a signal source 201 such as a microphone or an optical disk drive or any other sources of signals to be broadcast. The signal from the source is amplified by amplifier 202 which includes the driver 101 of the invention in combination with a power amplifier 102 as described above in relation to FIG. 1 or 4. The amplified signal is provided to a medium 203 such as an optical disk drive or an antenna for broadcasting or a laser transmitter connected to optical fibers.

The invention has been disclosed with reference to specific preferred embodiments, to enable those skilled in the art to make and use the invention, and to describe the best mode contemplated for carrying out the invention. Those skilled in the art may modify or add to these embodiments or provide other embodiments without departing from the spirit of the invention. Thus, the scope of the invention is only limited by the following claims:

What is claimed is:

1. An integrated circuit chip having an amplifier comprising:

a signal input for receiving a radio frequency input signal;

a first transistor with a control terminal for controlling the connection between a first terminal and a second terminal of the first transistor, the control terminal communicating with the signal input;

a second transistor with a control terminal for controlling the connection between a first terminal and a second terminal of the second transistor, the control terminal to communicating with the signal input, the second terminal of the second transistor communicating with the first terminal of the first transistor;

first pull-down connected between the first terminal of the second transistor and ground for reducing the current between the first terminal of the first transistor and ground when the first transistor is closed;

first pull-up means connected between the second terminal of the first transistor and a first reference voltage for reducing the current between the second terminal of the second resistor and the first reference voltage when the first transistor is closed;

a third transistor with a control terminal for controlling the connection between a first terminal and a second terminal of the third transistor;

connection means for conducting AC and DC current between the first terminal of the first transistor, the second terminal of the second transistor, and the control terminal of the third transistor;

second pull-up means connected between the first terminal of the third transistor and ground for reducing the current between the first terminal of the third transistor and ground when the third transistor is closed;

second pull-down means connected between the second terminal of the third transistor and a second reference voltage for reducing the current between the second terminal of the second transistor and the second reference voltage when the third transistor is closed; and an output terminal connected to the second terminal of the third transistor for providing an amplified radio frequency output signal depending on the radio frequency input signal.

2. The circuit chip of claim 1, in which:

the integrated circuit further comprises a connection between the output terminal and ground through a matching network and a load resistance;

the integrated circuit further comprises a second pre-amplifier connected between the signal input and the first pre-amplifier;

the integrated circuit further comprising a fourth transistor with a control terminal for controlling the connection between a first terminal and a second terminal of the fourth transistor, the second terminal of the third transistor being connected to the second pull-up means and to the output terminal through the first and second terminals of the fourth transistor, the control terminal of the fourth transistor being connected to ground through a capacitor and an inductance and being connected to a bias voltage through a resistance;

the first and second transistors are respectively PMOS and NMOS FETs and the control terminals are gates of the MOS transistors and the first terminals are sources and the second terminals are drains of the first and second MOS transistors;

a radio frequency signal at the control terminal of the third transistor has a negative excursions with a lower maximum amplitude than the maximum amplitude of positive excursions with respect to the average voltage of the signal at the control terminal;

the maximum amplitude of the negative excursion is 30% less than the maximum amplitude of the positive excursion at the control terminal of the third transistor;

the maximum amplitude of the negative excursion is less than half the maximum amplitude of the positive excursion at the control terminal of the third transistor;

the signal at the control terminal of the third transistor has a positive bias above the ground voltage level;

the voltage of the signal at the control terminal of the third transistor at the maximum negative excursion of the signal is approximately equal to ground level.

3. The circuit chip of claim 1, in which:

the integrated circuit further comprises a connection between the output terminal and ground through a matching network and a load resistance.

4. The circuit chip of claim 1, in which:

the integrated circuit further comprises a second pre-amplifier connected between the signal input and the first pre-amplifier.

5. The circuit chip of claim 1, in which:

the integrated circuit further comprising a fourth transistor with a control terminal for controlling the connection between a first terminal and a second terminal of the fourth transistor, the second terminal of the third transistor being connected to the second pull-up means and to the output terminal through the first and second terminals of the fourth transistor, the control terminal of the fourth transistor being connected to ground through a capacitor and an inductance and being connected to a bias voltage through a resistance.

6. The circuit chip of claim 1, in which:

the first and second transistors are respectively PMOS and NMOS FETs and the control terminals are gates of the MOS transistors and the first terminals are sources and the second terminals are drains of the first and second MOS transistors.

7. The circuit chip of claim 1, in which:

the signal at the control terminal of the third transistor has a positive bias above the ground voltage level.

8. The circuit chip of claim 1, in which:

a radio frequency signal at the control terminal of the third transistor has negative excursions with a lower maximum amplitude an the maximum amplitude of positive excursions with respect to the average voltage of the signal at the control terminal.

9. The circuit chip of claim 8, in which:

the maximum amplitude of the negative excursion is 20% less than the maximum amplitude of the positive excursion at the control terminal of the third transistor with respect to the average voltage of the signal at the control terminal.

10. The circuit chip of claim 8, in which:

the maximum amplitude of the negative excursion is less than half the maximum amplitude of the positive excursion at the control terminal of the third transistor with respect to the average voltage of the signal at the control terminal.

11. The circuit chip of claim 8, in which:

the voltage of the signal at the control terminal of the third transistor at the maximum negative excursion of the signal is approximately equal to ground level.

12. A circuit board assembly, comprising:

a circuit board having connection pads;

an integrated circuit chip with connection pads and positioned on a surface of the circuit board;

bond wires or flip-chip connections connecting between the connection pads on the integrated circuit chip and the connection pads on the circuit board;

the integrated circuit chip including:
  a signal input for receiving a radio frequency input signal;
  a first transistor 110 with a control terminal for controlling the connection between a first terminal and a second terminal of the first transistor, the control terminal communicating with the signal input;
  a second transistor with a control terminal for controlling the connection between a first terminal and a second terminal of the second transistor, the control terminal communicating with the signal input, the second terminal of the second transistor communicating with the first terminal of the first transistor,
  first pull-down means connected between the first terminal of the second transistor and ground for reducing the current between the first terminal of the first transistor and ground when the first transistor is closed;
  first pull-up means connected between the second terminal of the first transistor and a first reference voltage for reducing the current between the second terminal of the second resistor and the first reference voltage when the first transistor is closed;
  a third transistor with a control terminal for controlling the connection between a first terminal and a second terminal of the third transistor;
  connection means for conducting AC and DC current between the first terminal of the first transistor, the second terminal of the second transistor, and the control terminal of the third transistor;
  second pull-up means connected between the first terminal of the third transistor and ground for reducing the current between the first terminal of the third transistor and ground when the third transistor is closed;
  second pull-down means connected between the second terminal of the third transistor and a second reference voltage for reducing the current between the second terminal of the second transistor and the second reference voltage when the third transistor is closed; and
  an output terminal connected to the second terminal of the third transistor for providing an amplified radio frequency output signal depending on the radio frequency input signal.

13. A transmitter comprising:
means for providing an input signal;
means for amplifying the input signal; and
means for transmitting the amplified signal onto a transmission medium;
and in which, the amplifying means includes:
  a signal input for receiving a radio frequency input signal;
  a first transistor 110 with a control terminal for controlling the connection between a first terminal and a second terminal of the first transistor, the control terminal communicating with the signal input;
  a second transistor with a control terminal for controlling the connection between a first terminal and a second terminal of the second transistor, the control terminal communicating with the signal input, the second terminal of the second transistor communicating with the first terminal of the first transistor;
  first pull-down means connected between the first terminal of the second transistor and ground for reducing the current between the first terminal of the first transistor and ground when the first transistor is closed;
  first pull-up means connected between the second terminal of the first transistor and a first reference voltage for reducing the current between the second terminal of the second resistor and the first reference voltage when the first transistor is closed;
  a third transistor with a control terminal for controlling the connection between a first terminal and a second terminal of the third transistor;
  connection means for conducting AC and DC current between the first terminal of the first transistor, the second terminal of the second transistor, and the control terminal of the third transistor;
  second pull-up means connected between the first terminal of the third transistor and ground for reducing the current between the first terminal of the third transistor and ground when the third transistor is closed;
  second pull-down means connected between the second terminal of the third transistor and a second reference voltage for reducing the current between the second terminal of the second transistor and the second reference voltage when the third transistor is closed; and
  an output terminal connected to the second terminal of the third transistor for providing an amplified radio frequency output signal depending on the radio frequency input signal.

14. The transmitter of claim 13 in which:
the transmission is selected from one or more of: radio frequency electromagnetic radiation broadcast from an antenna; a radio frequency electronic signal transmitted through wires; light modulated with a radio frequency signal traveling through optical fibers; and data recording onto a record carrier.

\* \* \* \* \*